(12) United States Patent
Justice et al.

(10) Patent No.: US 6,545,555 B1
(45) Date of Patent: Apr. 8, 2003

(54) VOLTAGE CONTROLLED OSCILLATOR HAVING A PHASE NOISE REDUCTION DEVICE

(75) Inventors: Scott Justice, Durham, NC (US); Erik Bengtsson, Cary, NC (US)

(73) Assignee: Telefonaktiebolaget, LM Ericsson, Stockholm (SE)

( * ) Notice: Subject to any disclaimer, the term of this patent is extended or adjusted under 35 U.S.C. 154(b) by 111 days.

(21) Appl. No.: 09/689,570

(22) Filed: Oct. 12, 2000

(51) Int. Cl.[7] .............................. H03B 5/00; H03B 5/12
(52) U.S. Cl. ................ 331/117 R; 331/36 C; 331/113 R; 331/177 V; 331/175
(58) Field of Search ................ 331/117 R, 36 C, 331/175, 115, 108 C, 177 V, 167, 113 R, 111

(56) References Cited

U.S. PATENT DOCUMENTS

| | | | |
|---|---|---|---|
| 4,346,351 A | 8/1982 | Wilcox | 331/117 |
| 4,684,904 A | 8/1987 | Watkins et al. | 331/117 |
| 4,939,481 A | 7/1990 | DaSilva | 331/117 |
| 4,999,589 A | 3/1991 | DaSilva | 331/117 |
| 5,187,450 A * | 2/1993 | Wagner et al. | 331/117 D |
| 5,434,545 A | 7/1995 | Burchfield | 331/143 |
| 5,574,515 A | 11/1996 | Ogasawara | 348/731 |
| 5,581,215 A | 12/1996 | Ogasawara | 331/45 |
| 5,629,652 A | 5/1997 | Weiss | 331/108 |
| 5,635,879 A | 6/1997 | Sutardja et al. | 331/57 |
| 5,663,690 A | 9/1997 | McGinn | 331/109 |
| 5,714,914 A | 2/1998 | Zhou | 331/117 |
| 5,739,730 A | 4/1998 | Rotzoll | 331/177 |
| 5,740,213 A | 4/1998 | Dreyer | 375/374 |
| 5,805,089 A | 9/1998 | Fiedler et al. | 341/101 |
| 5,821,809 A | 10/1998 | Boerstler et al. | 327/563 |
| 5,936,445 A | 8/1999 | Babanezhead et al. | 327/157 |
| 5,949,290 A | 9/1999 | Bertram | 331/9 |

(List continued on next page.)

FOREIGN PATENT DOCUMENTS

EP 0 863 605 A 9/1998

OTHER PUBLICATIONS

Grebene, Alan B. *Bipolar and MOS Analog Integrated Circuit Design*. Ch. 8–9, pp. 397–453 (1984).
"Chapter 11: Harmonic Oscillators," *Hierarchical and Systematic Design of Analog Electronic Systems and Circuits*. pp. 54–61, CATENA Microelectronics (1995).

*Primary Examiner*—Arnold Kinkead
(74) *Attorney, Agent, or Firm*—Myers Bigel Sibley & Sajovec

(57) ABSTRACT

Differential voltage controlled oscillators are provided including a differential oscillator core, a first linear capacitor, a second linear capacitor, a first phase noise reduction device, and a second phase noise reduction device. The differential oscillator core has a first output that is capacitively coupled to a first differential input thereof by a first semiconductor junction having a first non-linear capacitance, and a second output that is capacitively coupled to a second differential input thereof by a second semiconductor junction having a second non-linear capacitance. The first linear capacitor is electrically cross-coupled from the first differential input to the second output, while the second linear capacitor electrically cross-coupled from the second differential input to the first output. The first phase noise reduction device has a first non-linear capacitance characteristic, and is electrically cross-coupled from the first differential input to the second output. The second phase noise reduction device has a second non-linear capacitance characteristic, and is electrically cross-coupled from the second differential input to the first output. By using the first and second phase noise reduction devices to add non-linear junction capacitance to each side of the differential structure, non-linear junction capacitances of the first and second semiconductor junctions are effectively canceled out to reduce the phase noise of the oscillators in which they are used.

26 Claims, 3 Drawing Sheets

U.S. PATENT DOCUMENTS

| | | | |
|---|---|---|---|
| 5,973,575 A | 10/1999 | Kamogawa et al. | 331/117 |
| 6,011,822 A | 1/2000 | Dreyer | 375/376 |
| 6,081,167 A | 6/2000 | Kromat | 331/108 |
| 6,198,359 B1 * | 3/2001 | Wichern | 331/117 R |

* cited by examiner

VOLTAGE CONTROLLED OSCILLATOR HAVING A PHASE NOISE REDUCTION DEVICE

BACKGROUND OF THE INVENTION

This invention relates to electronic oscillator circuits, and more particularly, to differential voltage controlled oscillator circuits.

In a tuned oscillator, the frequency of oscillation may be varied by means of a control signal. The term voltage controlled oscillator (hereinafter referred to as VCO) generally refers to a class of oscillators whose frequency is a function of the voltage of the input signal. Thus, conventional VCOs are constructed to generate an output signal having a frequency that is a function of the voltage of the input signal. VCOs are used in a wide variety of applications, and are particularly useful in transmitters and receivers to generate an oscillation at a specific frequency.

A conventional differential controlled oscillator 1 topology is shown in FIG. 1. This conventional differential VCO 1 topology includes biasing circuitry 2, an oscillator core 4, a tuning circuit 6, inductors 8a, 8b and output capacitors 10a, 10b.

The biasing circuitry generally provides the voltage drop that serves as the bias for core transistors 18, 20. The biasing circuitry comprises a bias resistor 12 or optionally a current source that is connected between ground 30 and the emitters of the core transistors 18, 20, and two bias resistors 14, 16 that are connected between the bases of the core transistors 18, 20. The biasing resistor 12 also provides some common mode rejection to the differential pair of the core transistors 18, 20. The two bias resistors 14, 16 provide a voltage input at the bases 18b, 20b of the core transistors 18, 20, respectively.

The oscillator core 4 may comprise, for example, at least one pair of bipolar junction transistors 18, 20 (referred to above as core transistors), a first pair of capacitors 22, 24, a capacitor 26 cross-coupled between the base 18b of core transistor 18 and the collector 20c of core transistor 20, and a second capacitor 28 cross-coupled between the base 20b of core transistor 20 and the collector 18c of core transistor 18. The two capacitors 22, 24 are connected between the bases of bipolar junction transistors 18, 20 and the AC ground node 30, respectively. Two cross-coupled linear capacitors 26, 28 provide a positive feedback loop to produce oscillations. The ratio between the two linear capacitors 26, 28 to the capacitors 22, 24, respectively sets the amount of positive feedback in the oscillator. The core transistors 18, 20 provide gain in the VCO 1, and emitters 18e and 20e of each core transistor 18, 20 are coupled to an AC ground node 30 by bias resistor 12.

The VCO 1 essentially functions as a signal generator that generates oscillations at a specific oscillation frequency (w). A tuning circuit 6 may comprise, for example, a pair of varactors 34a, 34b and a pair of bias resistors 36a, 36b connected in parallel across the varactors 34a, 34b. A capacitor 38a is coupled to the varactor 34a, and is connected between the collector 18c and the bias resistor 36a. Another capacitor 38b is coupled to the varactor 34b, and is connected between the collector 20c and the bias resistor 36b. The inductors 8a, 8b bias the collectors 18c, 20c of the core transistors 18, 20, and have some influence over the loop gain. Inductors 8a, 8b combine with the tuning circuit 6 create a variable tank circuit in the VCO 1. In other words, the inductors 8a, 8b, along with the total capacitance of the oscillator core 4, may be used to set the oscillation frequency of the VCO 1 which is $$w = \frac{1}{\sqrt{LC}}.$$

The inductance (L) of the VCO is determined primarily by the values of the inductors 8a, 8b, while the capacitance (C) of the VCO is all of the capacitance in the VCO 1. For example, the values chosen for the linear capacitors 26, 28 influence the oscillation frequency (w) of the VCO 1 since those linear capacitors are placed across the nodes of the tank circuit. Importantly, the total capacitance (C) of the VCO 1 can be varied via the tuning circuit 6 since each varactor 34a, 34b in the tuning circuit 6 can be characterized by a voltage-sensitive capacitance. The control voltage $V_{tune}$ 32 may be used to change the voltage across these varactors 34a, 34b, which in turn changes the capacitance of the varactors 34a, 34b to thereby change the total capacitance of the VCO 1. Thus, by changing the control voltage $V_{tune}$ 32, the oscillation frequency (w) of the VCO 1 is varied.

The output coupling capacitors 10a, 10b are connected between the output of the VCO 1 and the output terminals 40a, 40b of the VCO 1. The capacitors 10a, 10b couple the output signal to the next circuit, and determine how much signal will be coupled to the output. The total output signal is the difference between output A 40a and output B 40b or vice versa.

The performance of an oscillator may be characterized by a number of attributes, including spectral purity, frequency stability, and signal-to-noise ratio. To achieve frequency stability it is desirable to reduce the amount of phase noise. One problem that typically occurs in the VCO shown in FIG. 1 is that the output may exhibit an unacceptable level of phase noise which decreases the signal-to-noise ratio of the VCO.

The signal-to-noise ratio may be increased by increasing current in the VCO to increase the amount of signal with respect to phase noise. However, a 6 dB improvement in phase noise typically requires doubling of current in the VCO. Such an increase in current consumption is not an option in many applications. Accordingly, there is a need in the art for an improved VCO with reduced phase noise that may be implemented in a simple, inexpensive circuit. It would be highly desirable to reduce phase noise without an appreciable increase in current consumption. It is also highly desirable to accomplish both of these objectives without substantially increasing the cost or size of the VCO.

SUMMARY OF THE INVENTION

Differential voltage controlled oscillators are provided including a differential oscillator core, a first linear capacitor, a second linear capacitor, a first phase noise reduction device, and a second phase noise reduction device. The differential oscillator core has a first output that is capacitively coupled to a first differential input thereof by a first semiconductor junction having a first non-linear capacitance, and a second output that is capacitively coupled to a second differential input thereof by a second semiconductor junction having a second non-linear capacitance. The first linear capacitor is electrically cross-coupled from the first differential input to the second output, while the second linear capacitor electrically cross-coupled from the second differential input to the first output. The cross-coupled first and second linear capacitors provide a positive feedback loop to generate oscillations. The ratio between the first and second linear capacitors sets the amount of positive feedback in the oscillator. The first phase noise reduction device has a first non-linear capacitance characteristic, and is electrically cross-coupled from the first differential input to the second output. The second phase noise reduction device has a second non-linear capacitance characteristic, and is electrically cross-coupled from the second differential input to the first output. By using the first and second phase noise reduction devices to add non-linear junction capacitance to each side of the differential structure, the non-linear junction capacitances of the first and second semiconductor junctions are effectively canceled out to reduce the phase noise of the oscillator.

The first and second phase noise reduction devices are preferably p-n junction devices having non-linear capacitance characteristics that are preferably matched to the first and second non-linear capacitances over the entire oscillation cycle of the oscillator. For example, the first and second phase noise reduction devices may comprise first and second open-emitter bipolar transistors, respectively. In this situation, a non-linear capacitance of a collector-base junction of the first open-emitter bipolar transistor is preferably matched to the second semiconductor junction, while a non-linear capacitance of a collector-base junction of the second open-emitter bipolar transistor is preferably matched to the first semiconductor junction. The first semiconductor junction may comprise a collector-base junction of a first bipolar input transistor, while the second semiconductor junction may comprise a collector-base junction of a second bipolar input transistor. The first and second bipolar input transistors are also preferably matched.

According to another preferred embodiment, a differential voltage controlled oscillator circuit is provided for generating a low phase noise, differential signal. This differential voltage controlled oscillator circuit comprises means for generating oscillations including first and second oscillator output, a first input terminal capacitively coupled to the second oscillator output, a second input terminal capacitively coupled to the first oscillator output, first means for reducing phase noise, and second means for reducing phase noise. A tuning circuit may be connected across the first and second oscillator output terminals, and a tank circuit may be connected in parallel with the tuning circuit between the first and second oscillator output terminals of the voltage controlled oscillator. A first linear capacitor may be electrically cross-coupled from the first input terminal to the second output, while a second linear capacitor may be electrically cross-coupled from the second input terminal to the first output. The first means for reducing phase noise is connected between the first input terminal and the second oscillator output, while the second means for reducing phase noise is connected between the second input terminal and the first oscillator output. The first and second means for reducing phase noise preferably comprise p-n junction devices, for example, first and second open-emitter bipolar junction transistors. The means for generating oscillations preferably includes first and second core transistors of a differential pair of transistors. The collectors of the first and second bipolar junction transistors may be cross-coupled to collectors of the second and first core transistors of a differential pair of transistors, respectively. The bases of the first and second bipolar junction transistors are preferably coupled to bases of the first and second core differential transistors of the differential pair of transistors, respectively. Preferably, the first and second core transistors of the differential pair of transistors are substantially identical to the first and second bipolar junction transistors.

Accordingly, voltage controlled oscillators (VCOs) according to the present invention exhibit reduced phase noise and/or reduced current consumption due to reduction and/or cancellation of non-linear junction capacitance. This may be accomplished by adding a transistor in parallel with each of the main transistors in the oscillator core. By adding non-linear junction capacitance in this manner to the differential structure, non-linear junction capacitance of the collector-base is effectively canceled out to thereby reduce the phase noise of the oscillator since there is less capacitance change across the differential output nodes in the VCO. As a result, reduction in phase noise is achieved without an appreciable increase in current consumption. Moreover, the reduction in phase noise is accomplished by adding a small number of extra components to the VCO circuit, thereby conserving valuable space and production cost.

DETAILED DESCRIPTION OF THE PREFERRED EMBODIMENTS

Figure 1:
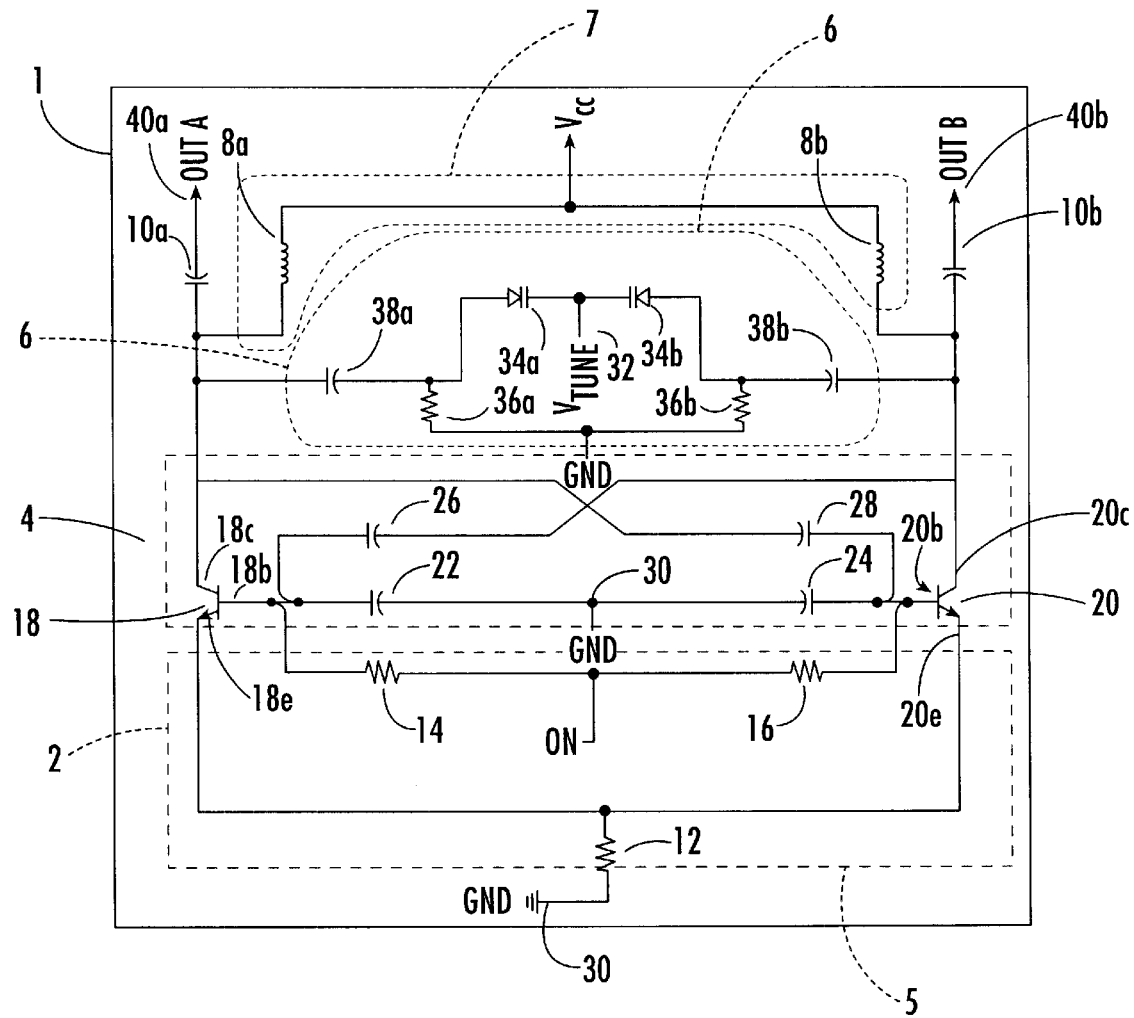
FIG. 1 is an electrical schematic showing a conventional differential voltage controlled oscillator (VCO).

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements.

Figure 2:
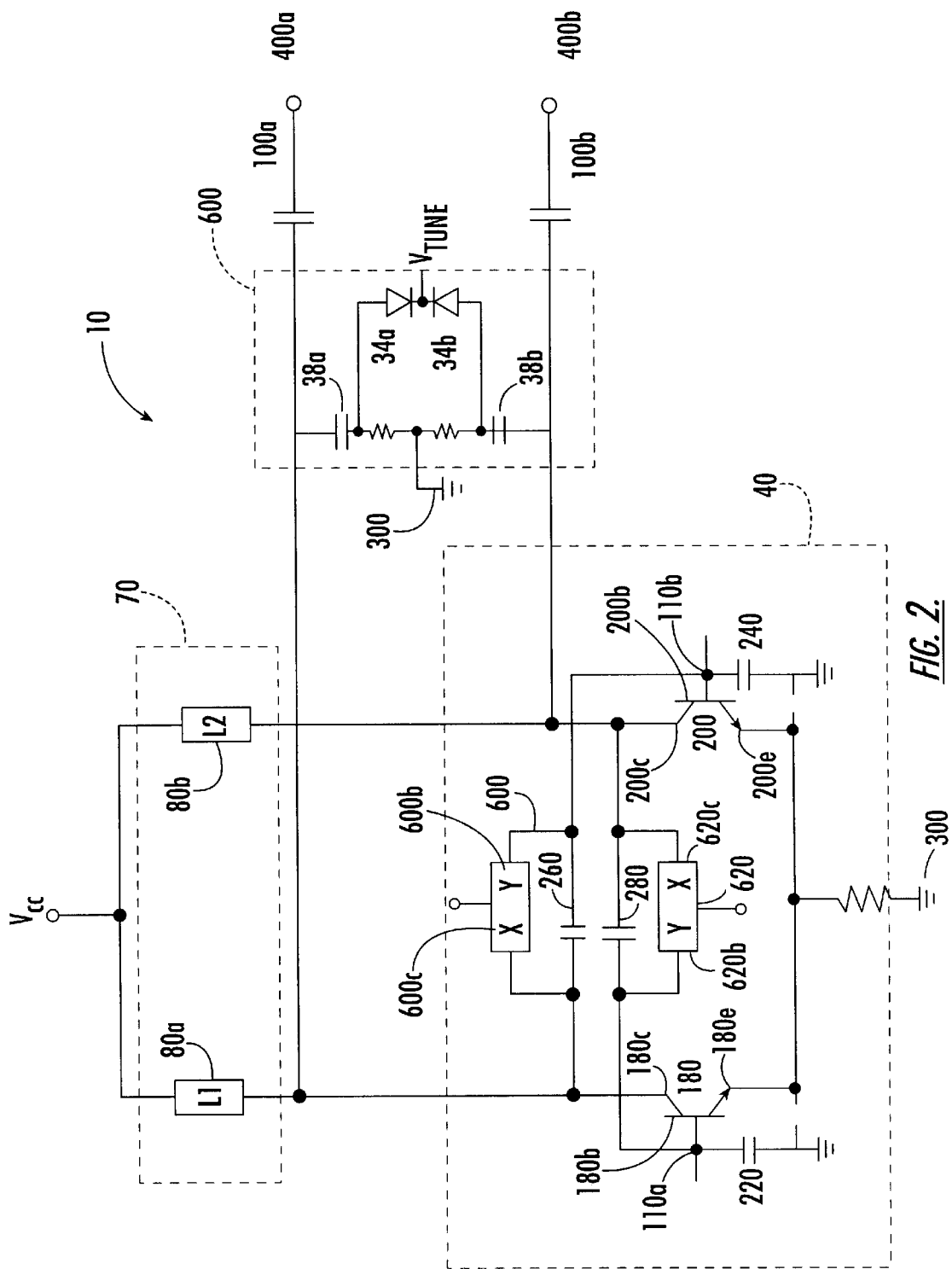
FIG. 2 shows an electrical schematic of a differential voltage controlled oscillator according to the present invention having two phase noise reduction devices for canceling out the collector-base non-linear junction capacitance at the oscillator output.

Referring now to FIG. 2, shown is a differential voltage controlled oscillator 10 including a differential oscillator core 40, a first linear capacitor 260, a second linear capacitor 280, a first phase noise reduction device 600, and a second phase noise reduction device 620. The differential oscillator core 40 has a first output that is capacitively coupled to a first differential input thereof by a first transistor 180 having a first non-linear capacitance, and a second output that is capacitively coupled to a second differential input thereof by a second transistor 200 having a second non-linear capacitance. The first linear capacitor 260 is electrically cross-coupled from the first differential input to the second output, while the second linear capacitor 280 electrically cross-coupled from the second differential input to the first output. The cross-coupled first and second linear capacitors 260, 280 provide a positive feedback loop to generate oscillations. The ratio between the first and second linear capacitors 260, 280 to the capacitors 220, 240, respectively sets the amount of positive feedback in the oscillator 10.

During oscillation, the current in a differential VCO 10 comprises a series of impulse functions with successive impulse functions alternating between the two sides of the VCO. Since the VCO output is differential, the total output current of the VCO is substantially constant. The non-linear components in the VCO may cause a phase shift to occur in the VCO output when an impulse is applied to the VCO. The non-linear junction capacitance of core transistors 180, 200 undesirably causes phase noise in the oscillator output. Unfortunately, any phase shift due to the current impulse may cause phase noise in the VCO 10 output. Therefore, as non-linear components are eliminated from the VCO 10, the amount of phase noise in the oscillator output decreases. Thus, by reducing the effects of non-linear junction capacitance associated with each of core transistors 180, 200, phase shifting that may occur when an impulse is applied to the conventional VCO 10 may be reduced.

To explain further, as a collector-base junction of a transistor is modulated, the voltage across that junction changes. This is because whenever a junction is modulated "mixing products" are created at new frequencies that do not exist in the original signal. These "mixing products" generate phase noise in the oscillator spectrum. This noise rolls off as the frequency moves away from the oscillation frequency in the oscillation spectrum. The capacitance of transistors 180, 200 changes in a non-linear manner during operation of the VCO 1. Stated differently, the base-to-collector capacitance of each core transistor 180, 200 varies depending on the voltage across the base-to-collector junction, and is independent of the current flowing through the device. Thus, the collector-base junctions in the differential VCO 10 are at different values of capacitance during all points in the oscillation cycle (except when the differential signal is at a zero crossing). Since different amounts of capacitance are added to the plus and minus nodes of the VCO 10 throughout the oscillation cycle, this changing capacitance effectively causes the oscillation frequency to deviate throughout the oscillation cycle, which in turn causes phase noise in the VCO 10. This voltage dependent capacitance undesirably changes the oscillation frequency of the VCO 10 output and changing of the oscillation frequency results in phase noise in the VCO 10.

The first phase noise reduction device 600 has a first non-linear capacitance characteristic, and is electrically cross-coupled from the first differential input to the second output. The second phase noise reduction device 620 has a second non-linear capacitance characteristic, and is electrically cross-coupled from the second differential input to the first output. By using the first and second phase noise reduction devices 600, 620 to add non-linear junction capacitance to each side of the differential structure, non-linear junction capacitances of the first and second semiconductor junctions 180, 200 are effectively canceled out to reduce the phase noise of the oscillator 10 in which they are used.

The first and second phase noise reduction devices 600, 620 are preferably p-n junction devices having non-linear capacitance characteristics that are substantially identical to the first and second non-linear capacitances over the entire oscillation cycle of the oscillator 10. For example, the first and second phase noise reduction devices 600, 620 may comprise first and second open-emitter bipolar transistors, respectively. In this situation, a non-linear capacitance of a collector-base junction of the first open-emitter bipolar transistor 600 is preferably matched to the second core transistor 200, while a non-linear capacitance of a collector-base junction of the second open-emitter bipolar transistor 620 is preferably matched to the first core transistor 180. The first core transistor 180 may comprise a collector-base junction of a first bipolar input transistor, while the second transistor 200 may comprise a collector-base junction of a second bipolar input transistor. The first and second bipolar input transistors are also preferably matched. Alternatively, the first phase noise reduction device 600 and the second phase noise reduction device 620 may comprise, for example, a first MOS junction and a second MOS junction, when MOS field effect transistors are used as the first and second core transistors 180, 200, respectively.

Figure 3:
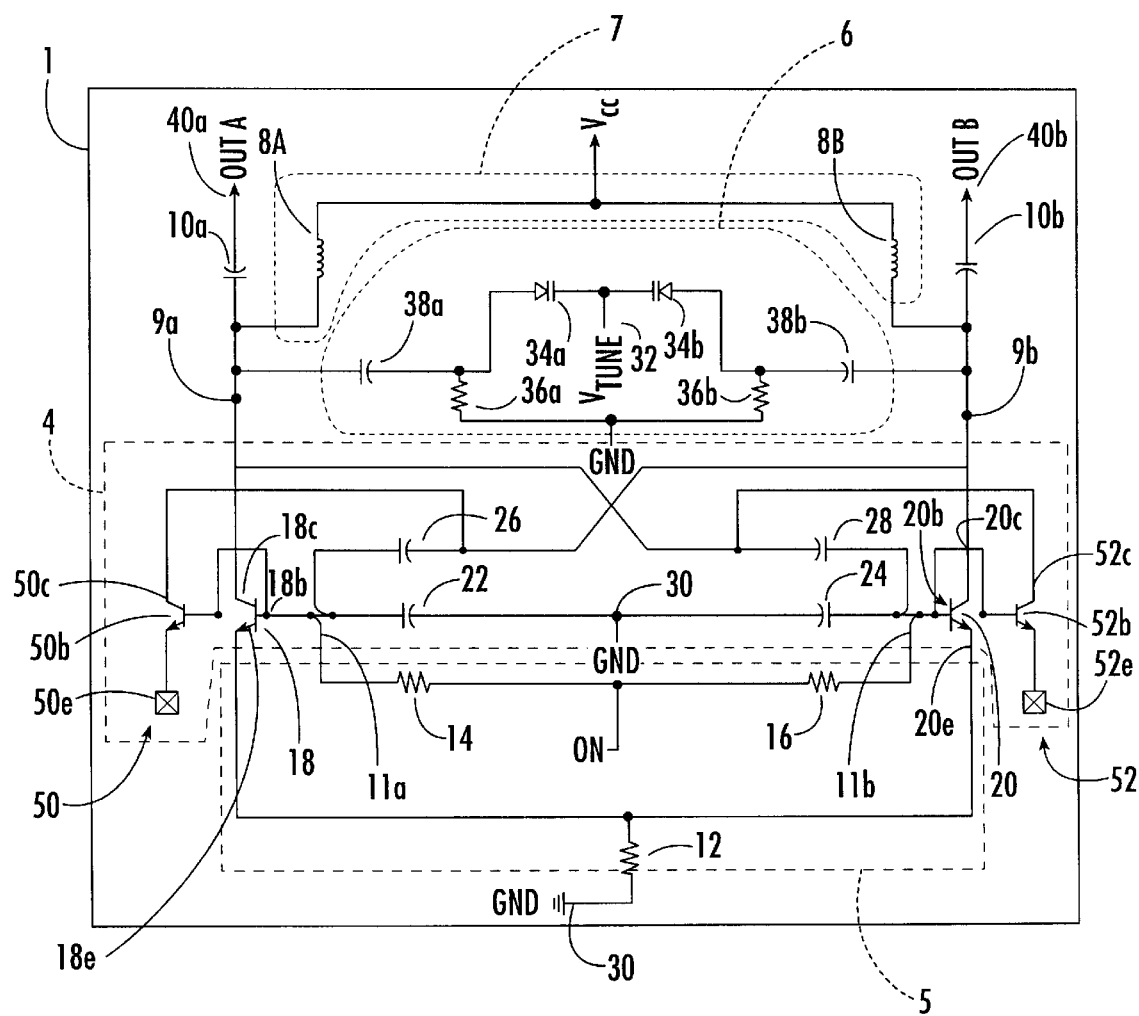
FIG. 3 is an electrical schematic of a differential voltage controlled oscillator according to a preferred embodiment of the present invention, having two transistors for canceling effects of the collector-base non-linear junction capacitance at the oscillator output.

Referring to other preferred embodiments of the present invention, shown in FIG. 3 is a differential VCO circuit for generating a low phase noise, differential signal. The VCO 1 comprises an oscillator core 4, a first phase noise reduction device 50, and a second phase noise reduction device 52. The oscillator core 4 may include first and second oscillator output terminals 9a, 9b, a first input terminal 11a capacitively coupled to the second oscillator output terminal 9b, and a second input terminal 11b capacitively coupled to the first oscillator output terminal 9a. The oscillator core 4 preferably includes a first core transistor 18 and a second core transistor 20 of a differential pair of transistors 18, 20. A tuning circuit 6 may be connected across the first and second oscillator output terminals 9a, 9b. A tank circuit 7 is preferably connected in parallel with the tuning circuit 6 between the first and second oscillator output terminals 9a, 9b of the voltage controlled oscillator 1. A first linear capacitor 26 may be electrically cross-coupled from the first input terminal 11a to the second output 9b, while a second linear capacitor 28 may be electrically cross-coupled from the second input 11b terminal to the first output 9a.

To reduce and/or completely cancel the effects of non-linear capacitance in the VCO to thereby reduce phase noise in the VCO, the present invention may cancel out collector-to-base, non-linear capacitance of core transistors 18, 20 by adding non-linear capacitance to each side of the differential VCO. By adding transistors 50, 52 in parallel with each of the main core transistors 18, 20 in the oscillator core 4, the collector-base junctions of these transistors 50, 52 remain biased just as core transistors 18, 20 in the oscillator core 4. However, by adding matching non-linear junction capacitance to opposite sides of the differential structure, the collector-base non-linear junction capacitance of the main core transistors 18, 20 is effectively canceled out. This reduces phase noise in the oscillator output since there is less capacitance change across the differential output nodes 40a, 40b of the VCO during the oscillation cycle.

The first phase noise reduction device 50 is preferably connected between the first input terminal 11a and the second oscillator output terminal 9b. The second phase noise reduction device 52 is preferably connected between the second input terminal 11b and the first oscillator output terminal 9a. The first and second phase noise reduction devices 50, 52 may comprise p-n junction devices, for example, first and second open-emitter bipolar junction transistors. The bases 18b, 20b of the first and second bipolar junction transistors 18, 20 are preferably coupled to bases 50b, 52b of the first and second core transistors 50, 52, respectively. On the other hand, the collectors 18c, 20c of the first and second bipolar junction transistors 18, 20 are preferably cross-coupled to collectors 52c, 50c of the second and first core transistors 52, 50, respectively. In one preferred embodiment, the first and second core transistors 50, 52 are substantially identical to the first and second bipolar junction transistors 18, 20. A biasing circuit 5 has first and second bias terminals 11a, 11b, and includes a plurality of bias resistors 12, 14, 16 connected to bias emitters 18e, 20e and bases 18b, 20b of the first and second core transistors 18, 20 of the differential pair of transistors. A first output coupling capacitor 10a is connected between the first differential output terminal 40a and the tank circuit 7, while the second output coupling capacitor 10b connected between the second differential output terminal 40b and the tank circuit 7.

Referring still to FIG. 3, the two open-emitter transistors 50, 52 are cross-coupled to cancel out the collector base capacitance associated with the main core transistors 18, 20. In essense, the transistors 50, 52 may be used as non-linear capacitors to cancel out non-linear junction capacitance of core transistors 18, 20. Since the VCO has a differential topology, cross-coupling the open-emitter transistors 50, 52 to the main core transistors 18, 20 results in exactly the same amount of nonlinear capacitance being added to each side of the VCO 1 to effectively cancel out the non-linear junction capacitance due to each of the main core transistors 18, 20. By coupling the unwanted portion of the signal to both sides of the differential structure, the unwanted signal is canceled out and does not appear in the differential output of 40a, 40b. Thus, the net effect is that the effect of collector-base capacitance of the core transistors 18, 20 is canceled out of the VCO output. As a result, the phase noise due to the transistor core non-linear junction capacitance is virtually eliminated, which in turn results in a purer output exhibiting an increased signal-to-noise ratio. At the same time, current consumption by the VCO is not appreciably increased.

The present invention advantageously improves the signal-to-noise ratio of the circuit without an appreciable increase in current consumption. By making the noise portion of the signal smaller, the overall signal-to-noise ratio is improved. In addition, since the extra transistors are relatively small there is only a small (1%) increase in the area occupied by the VCO.

The VCO 1 of the present invention may exhibit less phase noise than conventional VCO. At the desired carrier frequency of the VCO 1, the frequency response of the VCO 1 may include a spike at the oscillating frequency that eventually rolls off on both sides until the response eventually becomes flat far away from the center frequency. One of ordinary skill in the art would expect the frequency response curve of the VCO of the present invention to "roll off" at a much faster rate than conventional VCOs. Roll off can be described as the rate at which the amplitude of the frequency response attenuates, as frequency increases or decreases, from a center frequency of the VCO. In other words, moving away from the VCO carrier frequency (i.e., the oscillating frequency), the slope of the curve downwardly decreases until the curve eventually reaches a substantially flat portion. This flat portion of the frequency domain representation is indicative of a noise "floor" that will necessarily be present in most environments. This roll off merely indicates that the noise level continues to decrease moving away from the VCO carrier frequency (i.e., the oscillating frequency).

In general, the sharpness of the roll off characteristic of the VCO is one measure of VCO performance. Generally, a good VCO will roll off much faster than a poor VCO. The faster the response rolls off (i.e., the more quickly the response reaches the noise floor), indicates how well the VCO approximates an ideal VCO, and how well that particular VCO rejects noise. Thus, the sharper the roll off characteristic, the better the performance of the VCO since this may indicate that less phase noise is present in the VCO output, which may indicate an improved signal-to-noise ratio. In the present invention, the phase noise or amplitude of the frequency response at different offset frequencies away from the carrier frequency (i.e., oscillation frequency) may be attenuated more quickly in comparison to conventional VCOs.

In summary, to eliminate the non-linear capacitance of the core transistors 18, 20, the differential VCO of the present invention utilizes capacitance canceling transistors 50, 52 to cancel out the non-linear junction capacitance associated with the core transistors 18, 20, respectively. By cross-coupling an open emitter transistors 50, 52 to the opposite side of the circuit, the capacitance of the open emitter transistor 50, 52 effectively cancels out the capacitance from the base 18b, 20b to collector 18c, 20c of each of the main core transistors 18, 20. Advantageously, the present invention may reduce and/or completely cancel out the non-linear, collector-base capacitance associated with the core transistors 18, 20 so that the tank circuit sees only linear, positive feedback capacitance. As a result, phase noise in the oscillator output is reduced so that VCO 1 provides a low phase noise oscillation.

In the drawings and specification, there have been disclosed typical preferred embodiments of the invention and, although specific terms are employed, they are used in a generic and descriptive sense only and not for purposes of limitation, the scope of the invention being set forth in the following claims. The present invention may be applicable to any differential voltage control oscillator in which cancellation of non-linear, junction capacitance would be desirable and/or possible. As shown in FIG. 2, any junction device 600, 620 having a junction capacitance that changes substantially the same way as the capacitance of the core transistors 180, 200 of the VCO could be utilized, while junction capacitance that would cancel the non-linear junction capacitance in the VCO 10 would be preferably utilized. For instance, a matched p/n diode may be highly useful in canceling the non-linear junction capacitance in the oscillator core 40. Thus, a bipolar junction transistor 600, 620 or a diode 600, may possibly accomplish similar functions. A MOSFET capacitor having a MOS junction with depletion capacitance may also be utilized as phase noise reduction devices by substituting them for the BJTs of the present invention, since there is a junction capacitance from the drain to the substrate which can be partially cancelled out using the connection techniques according to the present invention. For instance, the differential oscillator core 40 may instead have a first output that is capacitively coupled to a first differential input thereof by a first MOS junction 600 having a first non-linear capacitance, while a second output thereof may be capacitively coupled to a second differential input thereof by a second MOS junction 620 having a second non-linear capacitance. In these preferred embodiments, the first and second phase noise reduction devices may comprise first and second open-source field effect transistors, respectively, wherein a non-linear drain-to-gate capacitance of the first open-source field effect transistor is matched to the second MOS junction 620, and wherein a non-linear drain-to-gate capacitance of the second open-source field effect transistor is matched to the first MOS junction 600. For example, the first MOS junction 600 may comprise a drain-to-gate capacitor of a first MOS input transistor, and the second MOS junction 620 may comprise a drain-to-gate capacitor of a second MOS input transistor. Preferably, the first and second MOS input transistors are matched.

That which is claimed is:

1. A differential voltage controlled oscillator, comprising:
 a differential oscillator core having a first output that is capacitively coupled to a first differential input thereof by a first semiconductor junction having a first non-linear capacitance and a second output that is capacitively coupled to a second differential input thereof by a second semiconductor junction having a second non-linear capacitance;

a first linear capacitor electrically cross-coupled from the first differential input to the second output;

a second linear capacitor electrically cross-coupled from the second differential input to the first output;

a first phase noise reduction device having a first non-linear capacitance characteristic, electrically cross-coupled from the first differential input to the second output; and a second phase noise reduction device having a second non-linear capacitance characteristic, electrically cross-coupled from the second differential input to the first output.

2. The oscillator of claim 1, wherein the first and second phase noise reduction devices comprise p-n junctions having non-linear capacitance characteristics that are matched to characteristics of the first and second non-linear capacitances.

3. The oscillator of claim 1, wherein said first and second phase noise reduction devices comprise first and second open-emitter bipolar transistors, respectively.

4. The oscillator of claim 3, wherein a non-linear capacitance of a collector-base junction of the first open-emitter bipolar transistor is matched to the second semiconductor junction; and wherein a non-linear capacitance of a collector-base junction of the second open-emitter bipolar transistor is matched to the first semiconductor junction.

5. The oscillator of claim 4, wherein the first semiconductor junction comprises a collector-base junction of a first bipolar input transistor; and wherein the second semiconductor junction comprises a collector-base junction of a second bipolar input transistor.

6. The oscillator of claim 5, wherein first and second bipolar input transistors are matched to each other.

7. A differential voltage controlled oscillator circuit for generating a low phase noise, differential signal, comprising:

an oscillator core including first and second oscillator output terminals, a first input terminal capacitively coupled to the second oscillator output terminal, and a second input terminal capacitively coupled to the first oscillator output terminal;

a first phase noise reduction device connected between the first input terminal and the second oscillator output terminal;

a second phase noise reduction device connected between the second input terminal and the first oscillator output terminal;

a first linear capacitor electrically cross-coupled from the first input terminal to the second output; and a second linear capacitor electrically cross-coupled from the second input terminal to the first output.

8. The differential voltage controlled oscillator circuit as recited in claim 7, wherein the first and second phase noise reduction devices comprise p-n junctions.

9. A differential voltage controlled oscillator circuit for generating a low phase noise, differential signal, comprising:

an oscillator core including first and second oscillator output terminals, a first input terminal capacitively coupled to the second oscillator output terminal, and a second input terminal capacitively coupled to the first oscillator output terminal;

a first phase noise reduction device connected between the first input terminal and the second oscillator output terminal; and a second phase noise reduction device connected between the second input terminal and the first oscillator output terminal;

wherein the first and second phase noise reduction devices comprise p-n junctions; and wherein the first and second phase noise reduction devices comprise first and second open-emitter bipolar junction transistors.

10. The differential voltage controlled oscillator circuit as recited in claim 9, wherein the oscillator core includes a first core transistor and a second core transistor.

11. The differential voltage controlled oscillator circuit as recited in claim 9, wherein collectors of the first and second bipolar junction transistors are cross-coupled to collectors of the second and first core transistors, respectively.

12. The differential voltage controlled oscillator circuit as recited in claim 11, wherein bases of the first and second bipolar junction transistors are coupled to bases of the first and second core transistors, respectively.

13. The differential voltage controlled oscillator circuit as recited in claim 12, wherein the first and second core transistors are matched to the first and second bipolar junction transistors.

14. The differential voltage controlled oscillator circuit as recited in claim 13, further comprising a tuning circuit connected across the first and second oscillator output terminals.

15. The differential voltage controlled oscillator circuit as recited in claim 14, further comprising a tank circuit connected in parallel with the tuning circuit between the first and second oscillator output terminals of the voltage controlled oscillator.

16. A differential voltage controlled oscillator circuit for generating a low phase noise, differential signal, comprising:

means for generating oscillations including first and second oscillator outputs;

a first input terminal capacitively coupled to the second oscillator output, and a second input terminal capacitively coupled to the first oscillator output;

first means for reducing phase noise connected between the first input terminal and the second oscillator output;

second means for reducing phase noise connected between the second input terminal and the first oscillator output;

a first linear capacitor electrically cross-coupled from the first input terminal to the second oscillator output; and a second linear capacitor electrically cross-coupled from the second input terminal and the first oscillator output.

17. The differential voltage controlled oscillator circuit as recited in claim 16, wherein the first and second means for reducing phase noise comprise p-n junction devices.

18. A differential voltage controlled oscillator circuit for generating a low phase noise, differential signal, comprising:

means for generating oscillations including first and second oscillator outputs;

a first input terminal capacitively coupled to the second oscillator output, and a second input terminal capacitively coupled to the first oscillator output;

first means for reducing phase noise connected between the first input terminal and the second oscillator output; and second means for reducing phase noise connected between the second input terminal and the first oscillator output;

wherein the first and second means for reducing phase noise comprise p-n junction devices; and wherein the first and second means for reducing phase noise comprise first and second open-emitter bipolar junction transistors.

19. The differential voltage controlled oscillator as recited in claim 18, wherein the means for generating oscillations includes first and second core transistors.

20. The differential voltage controlled oscillator circuit as recited in claim 19, wherein collectors of the first and second bipolar junction transistors are cross-coupled to collectors of the second and first core transistors, respectively.

21. The differential voltage controlled oscillator circuit as recited in claim 20, wherein bases of the first and second bipolar junction transistors are coupled to bases of the first and second core transistors, respectively.

22. The differential voltage controlled oscillator circuit as recited in claim 21, wherein the first and second core transistors are substantially identical to the first and second bipolar junction transistors.

23. The differential voltage controlled oscillator circuit as recited in claim 22, further comprising a tuning circuit connected across the first and second oscillator output terminals.

24. The differential voltage controlled oscillator circuit as recited in claim 23, further comprising a tank circuit connected in parallel with the tuning circuit between the first and second oscillator output terminals of the voltage controlled oscillator.

25. A differential voltage controlled oscillator circuit for generating a low phase noise, differential signal, comprising:

an oscillator core including first and second oscillator output terminals, a first input terminal capacitively coupled to the second oscillator output terminal, and a second input terminal capacitively coupled to the first oscillator output terminal; and a first phase noise reduction device connected between the first input terminal and the second oscillator output terminal; and a second phase noise reduction device connected between the second input terminal and the first oscillator output terminal;

wherein the first and second phase noise reduction devices comprise p-n junctions; and wherein the first oscillator output terminal is capacitively coupled to the first input terminal by a first semiconductor junction having a first non-linear capacitance that is matched to a non-linear capacitance of the first phase noise reduction device, and wherein the second oscillator output terminal is capacitively coupled to the second input terminal by a second semiconductor junction having a second non-linear capacitance that is matched to a non-linear capacitance of the second phase noise reduction device.

26. A differential voltage controlled oscillator circuit for generating a low phase noise, differential signal, comprising:

means for generating oscillations including first and second oscillator outputs;

a first input terminal capacitively coupled to the second oscillator output, and a second input terminal capacitively coupled to the first oscillator output;

first means for reducing phase noise connected between the first input terminal and the second oscillator output; and second means for reducing phase noise connected between the second input terminal and the first oscillator output;

wherein the first and second means for reducing phase noise comprise p-n junction devices; and wherein the first oscillator output terminal is capacitively coupled to the first input terminal by a first semiconductor junction having a first non-linear capacitance that is matched to a non-linear capacitance of the first phase noise reduction device, and wherein the second oscillator output terminal is capacitively coupled to the second input terminal by a second semiconductor junction having a second non-linear capacitance that is matched to a non-linear capacitance of the second phase noise reduction device.

* * * * *